(12) United States Patent
Huang et al.

(10) Patent No.: US 7,445,957 B2
(45) Date of Patent: Nov. 4, 2008

(54) METHOD FOR FABRICATING WAFER LEVEL SEMICONDUCTOR PACKAGE WITH BUILD-UP LAYER

(75) Inventors: Chien-Ping Huang, Taichung (TW); Cheng-Hsu Hsiao, Taichung (TW); Chih-Ming Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 121 days.

(21) Appl. No.: 11/580,560

(22) Filed: Oct. 12, 2006

(65) Prior Publication Data

US 2007/0034998 A1   Feb. 15, 2007

Related U.S. Application Data

(62) Division of application No. 10/846,460, filed on May 14, 2004, now Pat. No. 7,170,152.

(30) Foreign Application Priority Data

Mar. 11, 2004   (TW)   ............................... 93106438 A

(51) Int. Cl.
   *H01L 21/44*   (2006.01)
   *H01L 21/48*   (2006.01)
   *H01L 21/50*   (2006.01)

(52) U.S. Cl. ............... 438/106; 438/122; 257/E21.494; 257/E21.499; 257/E21.503; 257/E21.508; 257/E23.101

(58) Field of Classification Search ............... 438/106, 438/107, 108, 112, 122, 124, 126, 127, 687, 438/780
See application file for complete search history.

(56) References Cited

U.S. PATENT DOCUMENTS

| 5,868,887 | A |   | 2/1999  | Sylvester et al. |         |
|-----------|---|---|---------|------------------|---------|
| 6,020,637 | A | * | 2/2000  | Karnezos         | 257/738 |
| 6,154,366 | A |   | 11/2000 | Ma et al.        |         |
| 6,271,469 | B1| * | 8/2001  | Ma et al.        | 174/521 |
| 6,498,387 | B1|   | 12/2002 | Yang             |         |
| 7,170,152 | B2| * | 1/2007  | Huang et al.     | 257/678 |

* cited by examiner

*Primary Examiner*—David Nhu
(74) *Attorney, Agent, or Firm*—Peter F. Corless; Steven M. Jensen; Edwards Angell Palmer & Dodge LLP

(57) ABSTRACT

A wafer level semiconductor package with a build-up layer is provided, which includes a glass frame having a through hole for receiving a semiconductor chip therein, a low-modulus buffer material filled within the space formed between the semiconductor chip and the glass frame, a build-up layer formed on the glass frame and the semiconductor chip such that the build-up layer is electrically connected to the semiconductor chip, and a plurality of conductive elements mounted on the build-up layer so that the semiconductor chip is electrically connected to external devices. With the use of the glass frame and low-modulus buffer material, the wafer level semiconductor package thus-obtained is free from warpage, chip-crack, and delamination problems and the reliability thereof is enhanced. A method for fabricating the wafer level semiconductor package is also provided.

14 Claims, 7 Drawing Sheets

METHOD FOR FABRICATING WAFER LEVEL SEMICONDUCTOR PACKAGE WITH BUILD-UP LAYER

CROSS-REFERENCE TO RELATED APPLICATION(S)

This application is a divisional of application U.S. Ser. No. 10/846,460, filed on May 14, 2004, now U.S. Pat. No. 7,170,152.

FIELD OF THE INVENTION

The present invention relates to a wafer level semiconductor package and a method for fabricating the same, and more particularly, to a wafer level semiconductor package having a build-up layer formed on an active surface of a chip, by which external contacts for implantation of solder balls expose from the active surface of the chip and a method for fabricating the same.

BACKGROUND OF THE INVENTION

Along with requirements of tiny and light electronic products, semiconductor packages serving as central components for the electronic products are gradually becoming miniaturized. Chip scale package (CSP) which is one sort of miniaturized semiconductor packages is characterized that the size of such package is equivalent to or about 1.2 times bigger than that of the chip.

Furthermore, in addition to miniaturization for the semiconductor packages, high integration and the number of input/output connections (I/O connections) for electrically connecting external devices such as circuit boards have to be improved to achieve high electrical performance and high speed for the electronic products. Generally, a maximum number of bond pads are provided on an active surface of the chip to improve the number of the input/output connections. However, the number of the bond pads provided on the chip is limited by an area of the active surface and pitches between the bond pads. For more input/output connections to be further provided on the limited area, a wafer level package, such as a wafer level chip scale package (Wafer level CSP), is proposed.

Redistribution layer technology (RDL) is employed in the wafer level package, in which a dielectric layer formed on the active surface of the chip is provided with openings to expose the bond pad located on the active surface. Then, a plurality of conductive traces is provided on the dielectric layer, such that one end of each of the conductive traces electrically connects the bond pad located on the chip whereas the other end forms a contact. A solder mask layer is further disposed on the dielectric layer for covering the conductive trace and the bond pad. Finally, a plurality of openings is formed within the solder mask layer to expose the corresponding contact of the conductive trace for connecting a solder ball. Such build-up layer fabricated using the redistribution layer technology is capable of efficiently improving the number of the input/output connections for electrically connecting the chip and external devices. However, it is still restricted by the limited area of the active surface of the chip.

Again, in order to further improve the number of the input/output connections for electrically connecting the chip and the external devices, researches have focused on ways to fan out a layout boundary of the input/output connections to areas outside the active surface of the chip. Referring to FIG. 7, U.S. Pat. No. 6,271,469 has disclosed a packaging technology that fabricates build-up layers on an encapsulated chip that has an expanded area larger than the chip. In a semiconductor package 6, a chip 60 is encapsulated with an encapsulating material 62 formed by a molding process, by which an active surface 602 of the chip 60 exposes from a surface 622 of the encapsulating material 62 after encapsulation. A build-up layer 64 (consisting of a dielectric layer 642, conductive traces 644 and a solder mask layer 646) is disposed over the active surface 602 of the chip 60 and the surface 622 of the encapsulating material 62. The conductive trace 644 serves to electrically connect the build-up layer 64 and bond pads 604 of the chip 60. Thus, after a solder ball 66 is mounted on the build-up layer 64 and electrically connected to the conductive trace 644, the chip 60 is capable of electrically connecting the external devices via the solder ball 66.

The semiconductor package 6 can provide a larger area for distributing more input/output connections. However, the encapsulating material 62 is not formed on a high rigid substrate and the part for mounting the chip 60 is thinner than the part free of mounting the chip 60. Thus, warpage can be resulted during temperature cycling in subsequent processes. Further, a crack may be occurred in a position of a numeral 624 due to concentration of stresses. Delamination between the chip 60 and the encapsulating material may also be resulted due to the mismatch of coefficient of thermal expansion (CTE) between the encapsulating material 62 and the chip 60 encapsulated therein.

In the light of drawbacks of the foregoing U.S. Pat. No. 6,271,469, U.S. Pat. No. 6,498,387 has disclosed a semiconductor package having a glass for carrying chips. Referring to FIG. 8, in a semiconductor package 7, a chip 70 mounted on a glass 71 is encapsulated by being coated with an epoxy layer 72. A plurality of openings is provided on the epoxy layer 72 to expose bond pads 702 located on the chip 70. Then, a plurality of conductive traces 73 is provided on the epoxy layer 72 for electrically connecting the bond pads 702. Subsequently, a solder mask layer 74 is disposed on the epoxy layer 72 for covering the conductive traces 73 and then a plurality of openings is provided through the solder mask layer 74 to partially expose the conductive traces 73 for mounting solder balls 75.

The foregoing U.S. Pat. No. 6,498,387 uses the glass 71 for carrying the chip 70, by which the high rigidity of the glass 71 is capable of solving the problems in the U.S. Pat. No. 6,217,496, such as the warpage and crack caused by the encapsulating material. Also, as the glass 71 has a CTE close to that of the chip 70, the delamination caused by the mismatch of CTE can be eliminated. However, the chip 70 is mounted onto the glass 71, such that the semiconductor package 7 cannot meet the requirement of miniaturization as the total thickness of the entire package is the sum of the chip 70, the glass 71 and build-up layers disposed on the chip 70. Additionally, during temperature cycling in subsequent processes, thermal stresses may cause a crack in the chip 70 which is completely encapsulated by the epoxy layer 72 as the CTE for the chip 70 and the epoxy layer 72 may be mismatched. Further, external water vapors may accumulate on an active surface of the chip 70 via the epoxy layer 72 having high moisture absorption as both sides of the epoxy layer 72 are directly exposed in atmosphere. Therefore, a so-called 'popcorn phenomenon' would be resulted to thereby not enhancing the reliability of the products.

Accordingly, the semiconductor packages proposed in the U.S. Pat. Nos. 6,217,496 and 6,498,387 are inherent with significant problems which have to be solved.

SUMMARY OF THE INVENTION

An objective of the present invention is to provide a wafer level semiconductor package with a build-up layer, which is free from warpage, crack, and delamination problems and enhances the reliability thereof.

Another objective of the present invention is to provide a wafer level semiconductor package with a build-up layer, which can be efficiently miniaturized.

Still another objective of the present invention is to provide a method for fabricating a wafer level semiconductor package with a build-up layer without using a mold for injecting encapsulating materials to thereby minimizing fabrication costs.

A further objective of the present invention is to provide a wafer level semiconductor package with a build-up layer, which can enhance the reliability of products due to low moisture absorption.

In accordance with the above and other objectives, the present invention proposes a wafer level semiconductor package with a build-up layer, which comprises a rigid frame being provided with at least a through hole, at least a chip received in the rigid frame in which a space exists between the chip and the rigid frame, a low-modulus buffer material filled in the space, a build-up layer formed on the chip and the rigid frame by which the build-up layer is electrically connected to the chip, and a plurality of conductive elements for electrically connecting the build-up layer.

When a thickness of the chip is the same as that of the rigid frame, an inactive surface (referring to a surface relative to an active surface of the chip, on which the active surface is electrically connected to the build-up layer) of the chip is exposed from the semiconductor package for attaching a heat sink or heat spreader to thereby directly dissipating heat generated by the chip during operation, so as to improve heat dissipation. When the thickness of the chip is slightly smaller than that of the rigid frame, the low-modulus buffer material is capable of covering the inactive surface of the chip to preferably protect the chip.

Consistent with the foregoing U.S. Pat. Nos. 6,271,469 and 6,498,387, the build-up layer comprises at least a dielectric layer, a plurality of conductive traces formed on the dielectric layer for electrically connecting bond pads located on the active surface of the chip and a solder mask layer coated on the dielectric layer and the conductive trace, in which a plurality of openings is provided through the solder mask for electrically connecting the conductive element and the conductive trace.

The present invention also proposes a method for fabricating a wafer level semiconductor package with a build-up layer. First of all, a rigid frame having a plurality of through holes arranged in arrays is placed within a jig. At least a chip is placed in the jig via a corresponding through hole, by which a low-modulus buffer material is filled in a predetermined space formed between the chip and the rigid frame to separate the chip and the rigid frame. After baking the buffer material, the jig is separated from the rigid frame. Subsequently, a build-up layer which electrically connects the chip is formed for mounting a plurality of conductive elements which electrically connects the build-up layer, such that the chip can be electrically connected to external devices via the conductive element. Finally, a plurality of wafer level semiconductor packages with build-up layers is formed by performing a singulation process.

In another preferred embodiment of the present invention, the chip has to be mounted on a predetermined position on the jig prior to be combined with the rigid frame having a plurality of through holes. After combination, the chip is positioned in the corresponding through hole within the rigid frame.

Moreover, the 'rigid frame' in this specification is defined as a rigid frame made of chemical engineering materials known in the prior-art, which does not result in the warpage under high temperatures or during temperature cycling. The low-modulus buffer material is defined as a material having thermoelastic effects and a small CTE.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

First Embodiment

Figure 1:
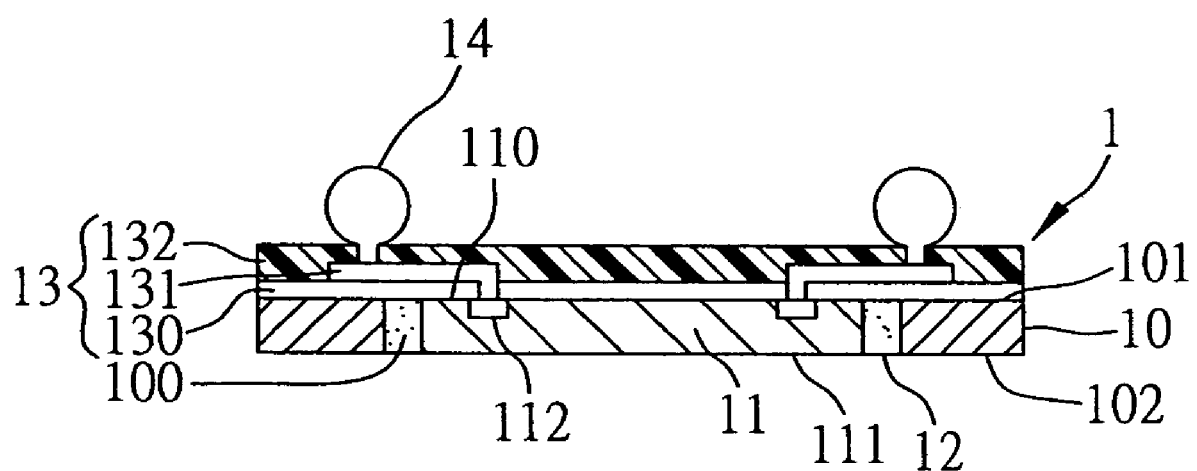
FIG. 1 is a cross-sectional view of a wafer level semiconductor package according to the first embodiment of the present invention.

Referring to FIG. 1, a wafer level semiconductor package 1 with a build-up layer 13 mainly comprises a rigid frame 10 having a through hole 100, a chip 11 received in the through hole 100 of the rigid frame 10, a low-modulus buffer material 12 filled between the rigid frame 10 and the chip 11, a build-up layer 13 disposed on the rigid frame 10 and the chip 11 and a plurality of solder balls 14 (equivalent to the foregoing conductive elements) mounted on the build-up layer 13.

The rigid frame 10 is made of a material selected from the group consisting of glass, metal (such as copper metal and the like) and thermosetting materials (such as polyimide resins, bismaleimide triazine resins (BT resins), RF-4, and the like). The rigid frame 10 can serve as a primary structured body for the wafer level semiconductor package 1 without causing a warpage problem as it does not generate warpage under high temperature or during temperature cycling of fabrication. Furthermore, unlike the foregoing U.S. Pat. No. 6,271,469, a crack will not occur in the encapsulating material due to a high rigidity of the rigid frame 10. The through hole 100 of the rigid frame 10 is provided through a first surface 101 and a corresponding second surface 102 of the rigid frame 10, such that the through hole 100 is located in a middle position of the rigid frame 10.

The chip 11 includes an active surface 110 having electronic components and electronic circuits as well as an inactive surface 111 relative to the active surface 110. When the chip 11 is received in the through hole 100 of the rigid frame 10, the active surface 110 and the inactive surface 111 respectively form coplanes with the first surface 101 and the second surface 102 of the rigid frame 10. Thus, a thickness of the chip 11 is the same as that of the rigid frame 10. Additionally, the chip 11 and the rigid frame 10 do not contact with each other as a space is formed between the chip 11 received in the through hole 100 of the rigid frame 10 and the rigid frame 10. Moreover, a plurality of bond pads 112 is provided on the active surface 110 of the chip 11.

The low-modulus buffer material 12 is made of a material with low-modulus selected from the group consisting of polyimide resins, silicone gel and epoxy resins. After being filled between the chip 11 and the rigid frame 10, the low-modulus buffer material 12 with elastic characteristics serves as a buffer medium to release thermal stresses caused by the mismatch of CTE between the chip 11 and the rigid frame 10 during the temperature cycling of fabrication. Thus, the crack and delamination of the chip 11 will not be resulted to therefore improve yields and reliability of products fabricated using the wafer level semiconductor package 1 proposed in the present invention.

The build-up 13 comprises a dielectric layer 130 disposed on the chip 11 and the rigid frame 10, a plurality of conductive traces 131 formed on the dielectric layer 130 for electrically connecting the bond pad 112 of the chip 11 and a solder mask layer 132 for covering the dielectric layer 130 and the conductive trace 131. The build-up layer 13 and the method thereof are already known in the prior-art and therefore are not further described. Also, the build-up layer 13 can form at least one more dielectric layer or a plurality of more conductive traces (not shown) on the dielectric layer 130 and the conductive trace 131 depending on practical requirements.

FIGS. 2A to 2G are diagrams showing steps of a method for fabricating the foregoing wafer level semiconductor package 1 shown in FIG. 1.

Figure 2A:
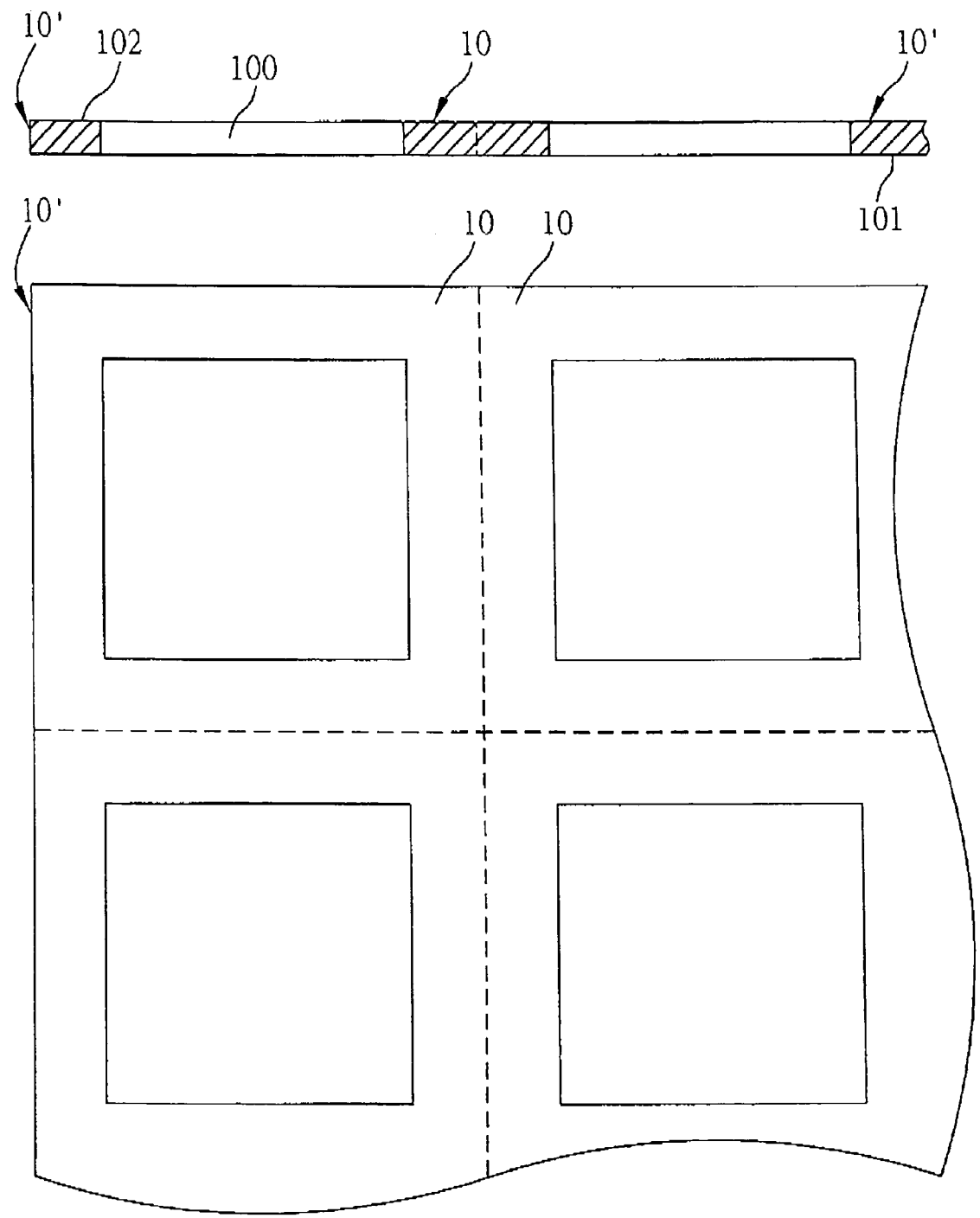
FIGS. 2A to 2G are flowcharts showing steps of a method for fabricating the wafer level semiconductor package shown in FIG. 1.

Referring to FIG. 2A, the first step of fabricating the wafer level semiconductor package according to the first embodiment of the present invention is to prepare a module board 10' made of glass materials, which comprises a plurality of rigid frames 10 (separated by phantom lines ) having rectangular through holes 100 located in middle positions. Each of the rigid frames 10 includes a first surface 101 and a relative second surface 102.

Figure 2B:
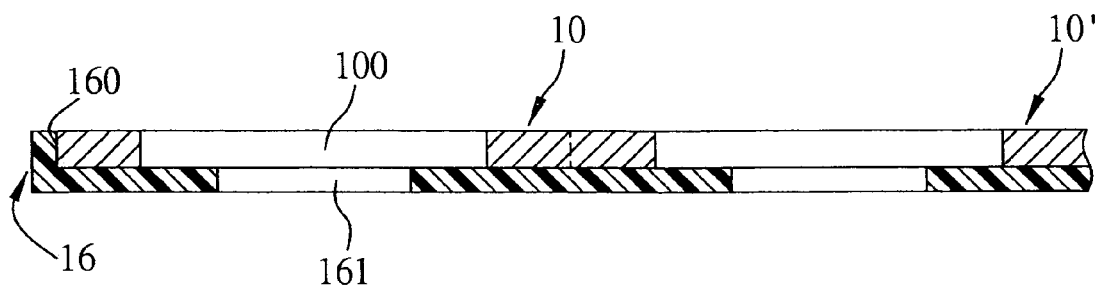

Referring to FIG. 2B, the module board 10' is placed in a receiver 160 of a jig 16 which has a through hole 161 connecting the receiver 160. Each of the through holes 161 of the jig 16 is provided in a middle position of each of the corresponding through holes 100 of the module board 10'.

Figure 2C:
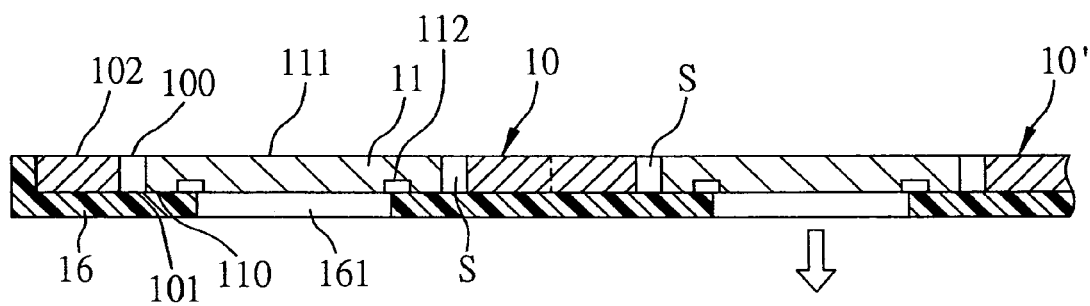

Referring to FIG. 2C, a chip 11 is placed on each of the through holes 100, in which the active surface 110 of the chip 11 is positioned downwardly to face the through hole 161 of the jig 16 and the inactive surface 111 is faced upwardly to be exposed in atmosphere. Further, the thickness of the chip 11 is to be the same as that of the module board 10'. Thus, when the chip 11 is placed into the through hole 100 to be carried by the module board 10', the inactive surface 111 is still coplanar with the second surface 102 of each of the rigid frames 10. Additionally, a cross section area of the through hole 100 is larger than a surface area of the chip 11. Thus, when the chip 11 is placed into the through hole 100, a predetermined space S is formed as the chip 11 does not contact with a hole wall of the through hole 100. After the chip 11 is placed on a predetermined position of the jig 16 via the through hole 100, air in the through hole 161 is released to adsorb the chip 11 on the jig 16.

Figure 2D:
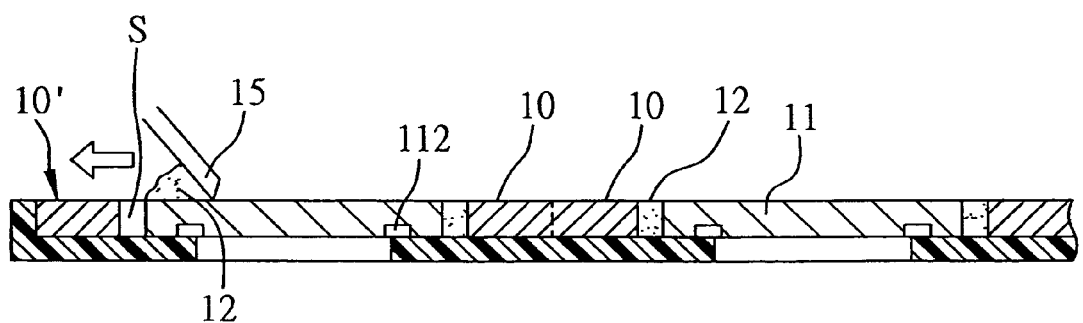

Referring to FIG. 2D, as the module board 10' has a function of screen printing, a scraper 15 serves to fill the low-modulus buffer material 12 such as silicone gel, epoxy resins or polyimide resins into the space S between the chip 11 and the rigid frame 10 by a screen-printing method without using another screen-printing plate. As a result, the chip 11 is separated from the rigid frame 10 by the low-modulus buffer material 12.

Figure 2E:
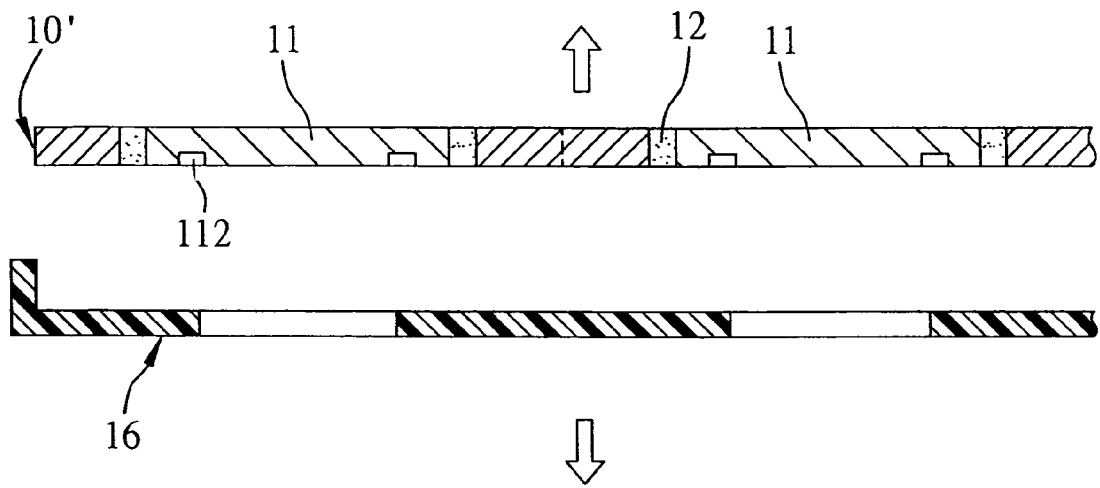

Referring to FIG. 2E, after appropriately baking the low-modulus buffer material 12 (not shown), the module board 10' receiving the chip 11 is separated from the jig 16.

Figure 2F:
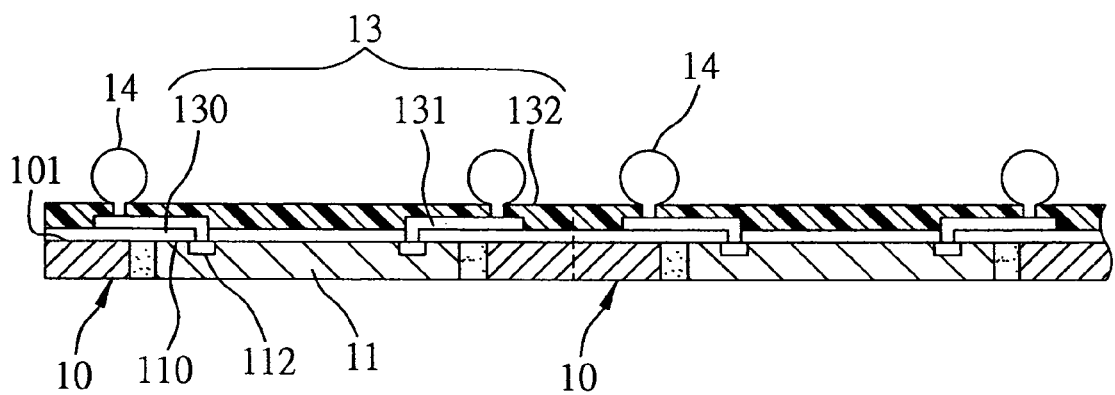

Referring to FIG. 2F, a dielectric layer 130 is coated on the first surface 101 of each of the rigid frames 10 and the active surface 110 of each of the chips 11 before providing through holes (not shown) corresponding to the bond pad 112 located on the active surface 110 of the chip 11 using prior-art techniques which include, but are not limited to, photolithographic technique and laser drilling. Then, a plurality of patterned conductive traces 131 is provided on the dielectric layer 130 using any prior-art technique that includes, but is not limited to, photolithographic technique. Thus, one end of each of the conductive traces 131 electrically connects the bond pad 112 on the chip 11 via the through hole of the dielectric layer 130, such that the conductive trace 131 protrudes outwardly from the bond pad 112 to reach the periphery of the chip 11. The other end of each of the conductive traces 131 forms a contact terminal (a numeral not shown). Subsequently, a solder mask layer 132 is disposed on the conductive trace 131 and the dielectric layer 130 prior to provide a plurality of openings (a numeral not shown) to expose the contact terminal of the conductive trace 131 using any prior-art technique. Thus, a plurality of solder balls 14 is respectively mounted on the contact terminal of the conductive trace 131, such that the solder ball 14 electrically connects the build-up layer 13 comprised of the dielectric layer 130, the conductive trace 131 and the solder mask layer 132. The solder ball 14 and the implantation method thereof are known in the prior-art and therefore are not further described.

Figure 2G:
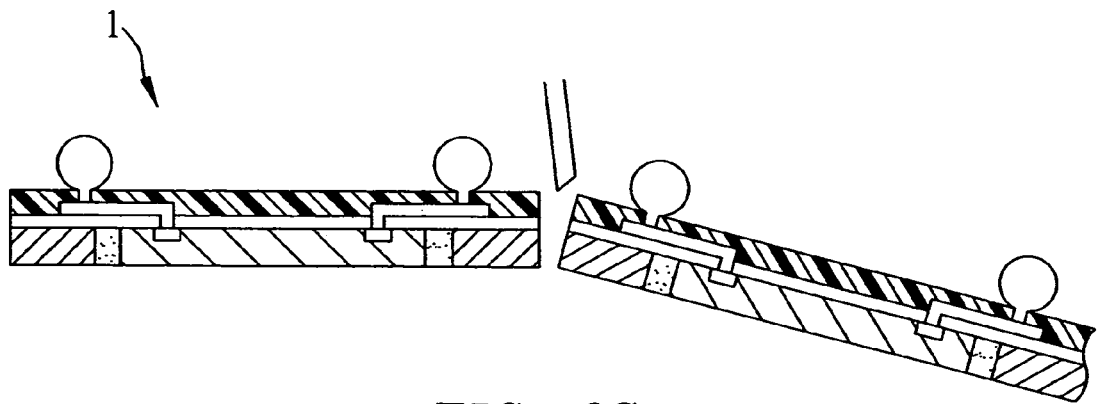

Referring to FIG. 2G, singulation is performed using any prior-art method to form the wafer level semiconductor package 1 shown in FIG. 1.

Accordingly, the chip 11 and the rigid frame 10 of the wafer level semiconductor package 1 proposed in the present invention is separated by the low-modulus buffer material 12, such that thermal stresses generated by the rigid frame 10 during the temperature cycling of fabrication can be effectively released by the low-modulus buffer material 12. The rigid frame 10 serving as the primary structured body of the wafer level semiconductor package 1 is capable of simplifying the fabrication as the chip is not encapsulated using prior-art molding compounds, so as to prevent the warpage of the encapsulating material formed by the prior-art molding compounds as well as to avoid the crack and delamination of the chip. Moreover, the rigid frame 10 can further serve as the screen-printing plate for filling the low-modulus buffer material 12 into the space S between the chip 11 and the rigid frame 10 using the screen-printing method, such that a screen-printing plate is unnecessary in the method proposed in the present invention to thereby minimize the fabrication cost.

As the chip 11 of the wafer level semiconductor package 1 proposed in the present invention is received within the rigid frame 10, a height of the wafer level semiconductor package 1 is a total height of the rigid frame 10, the build-up layer 13 and the solder ball 14, which is obviously smaller than that of the package (A height refers to a total height of the glass carrier, the chip, the build-up layer and the solder ball) disclosed in the U.S. Pat. No. 6,498,387. Thus, the wafer level semiconductor package 1 proposed in the present invention meets the requirement of miniaturization. For further miniaturizing the wafer level semiconductor package 1 proposed in the present invention, after a process shown in FIG. 2D, a grinding process is performed on the second surface 102 of each of the rigid frames 10, the inactive surface 111 of the chip 11 and an exposed surface of the low-modulus buffer material 12 using any prior-art method which includes, but is not limited to, mechanical grinding, such that thicknesses of the rigid frame 10, the chip 11 and the low-modulus buffer material 12 are reduced. The grinding process is known in the prior-art and is therefore not demonstrated by the drawings and not further described.

Second Embodiment

The fabrication to be demonstrated in the second embodiment of the present invention is similar to that of the foregoing first embodiment. Thus, only differences between these two embodiments are further described by using the drawings.

Figure 3A:
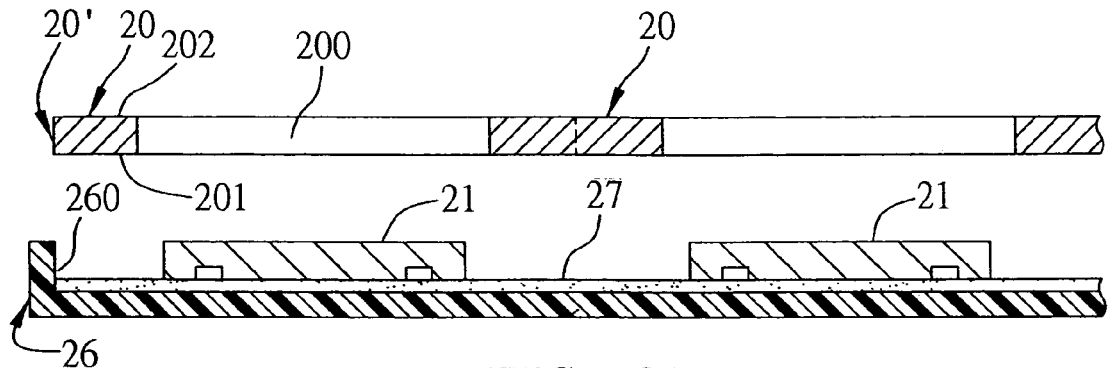
FIGS. 3A to 3D are flowcharts showing steps for forming the wafer level semiconductor package shown in FIG. 1 prior to form a build-up layer according to another embodiment.

Referring to FIG. 3A, a module board 20' consisting of a plurality of rigid frames 20 arranged in arrays is provided, in which each of the rigid frames 20 comprises a rectangular through hole 200, a first surface 201 and a relative second surface 202. Also, a jig 26 having a receiver 260 is provided, in which a film 27 is adhered on bottom of the receiver 260 and a plurality of chips 21 is mounted on predetermined positions on the film 27. Materials of the film 27 are selected from those providing an adhesion between the film 27 and the jig 26 larger than that between the film 27 and the chip 21 and between the film 27 and the module board 20'.

Figure 3B:
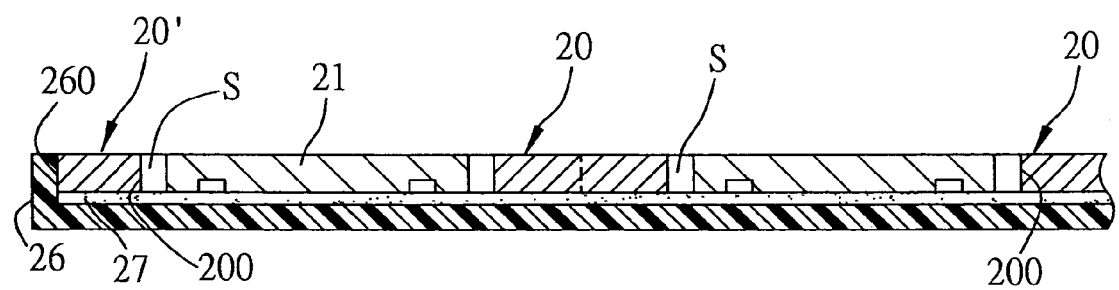

Referring to FIG. 3B, the module board 20' is placed into the receiver 260 of the jig 26, such that the module board 20' is adhered onto the film 27. The chips 21 on the film 27 are respectively received in each of the corresponding through holes 200 of each of the rigid frames 20, by which a space S is formed between the chip 21 and the rigid frame 20.

Figure 3C:
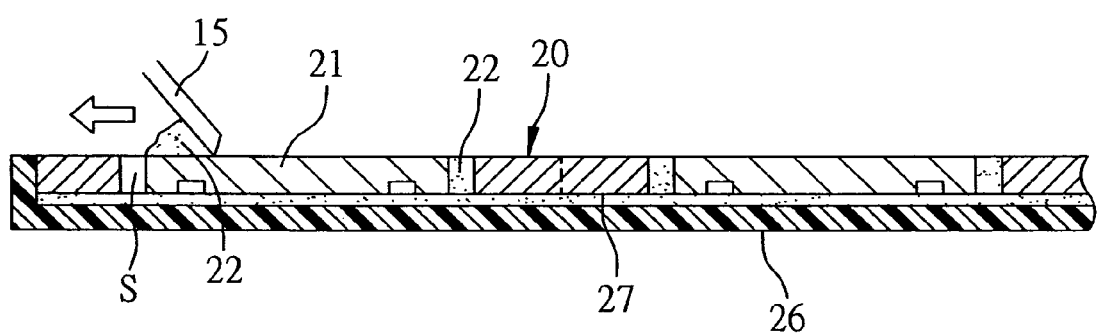

Referring to FIG. 3C, as the module board 20' can serve as a screen-printing plate, a scraper 15 serves to fill a low-modulus buffer material 22 into the space S between the chip 21 and the rigid frame 20 using a screen-printing method. Thus, the chip 21 is separated from the rigid frame 20 by the low-modulus buffer material 22. Further, an adhesion between the used low-modulus buffer material 22 and the film 27 has to be smaller than that between the jig 26 and the film 27.

Figure 3D:
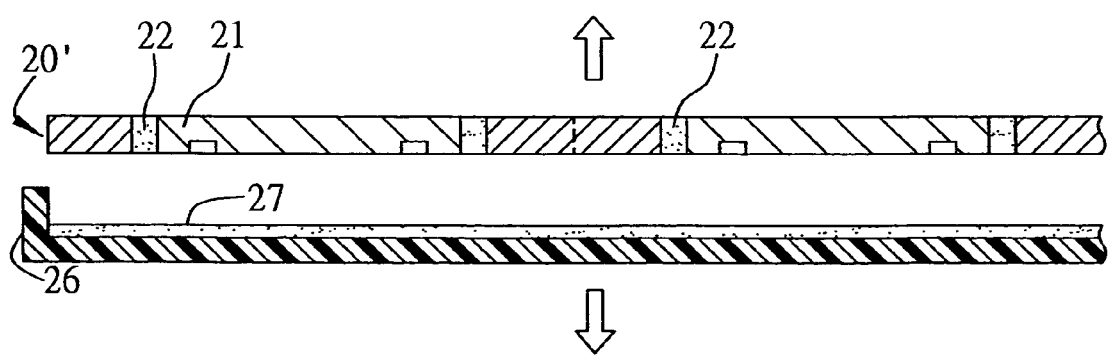

Referring to FIG. 3D, after baking the low-modulus buffer material 22, the module board 20' receiving the chip 21 is separated from the jig 26. The adhesion between the jig 26 and the film 27 is larger than that between the module board 20' and the film 27, the chip 21 and the film 27, and the low-modulus buffer material 22 and the film 27, so that the film 27 still adheres to the jig 26 without detaching with the module board 20' after separation of the module board 20' and the jig 26 is performed.

Steps of fabrication of the build-up layer, ball implantation and singulation and fabricated articles are the same as that of the first embodiment and therefore are not further described.

Third Embodiment

Figure 4:
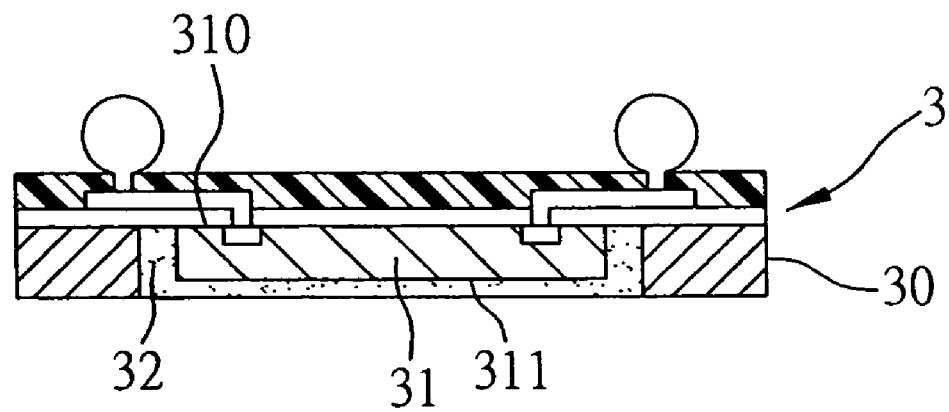
FIG. 4 is a cross-sectional view of a wafer level semiconductor package according to the third embodiment of the present invention.

FIG. 4 is a cross-sectional view of a wafer level semiconductor package according to the third embodiment of the present invention. The structure of a wafer level semiconductor package 3 according to the third embodiment is similar to that of the first embodiment. Differently, a thickness of a chip 31 is smaller than that of a rigid frame 30. Thus, when a low-modulus buffer material 32 is filled into a space between the chip 31 and the rigid frame 30 using a screen-printing method, an inactive surface 311 of the chip 31 is covered by the low-modulus buffer material 32, such that the chip 31 is completely encapsulated by the low-modulus buffer material 32 except for an active surface 310 of the chip 31. Therefore, criteria required for a consistent thickness for the rigid frame 30 and the chip 31 can be less stringent, so that when the thickness of the chip 31 is smaller than that of the rigid frame 30, a thickness difference is between 0.05 mm and 0.5 mm, and preferably 0.1 mm.

Fourth Embodiment

Figure 5:
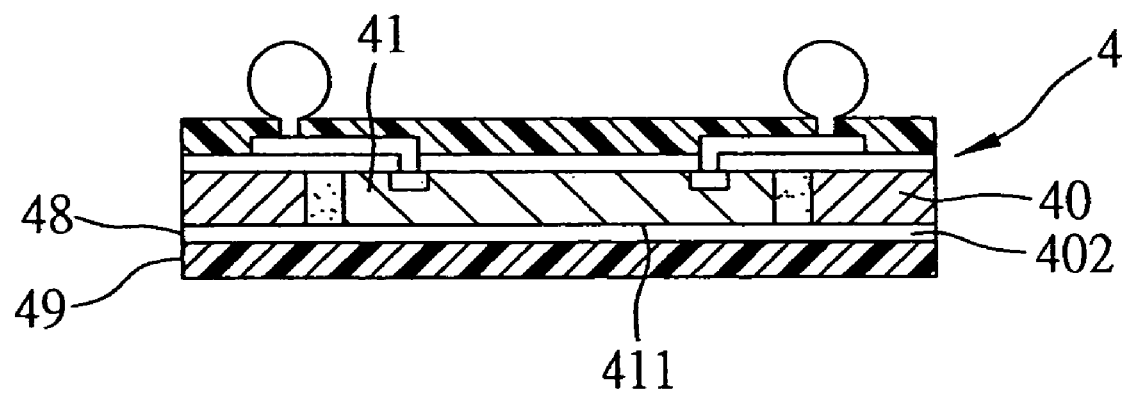
FIG. 5 is a cross-sectional view of a wafer level semiconductor package according to the fourth embodiment of the present invention.

FIG. 5 is a cross-sectional view of a wafer level semiconductor package according to the fourth embodiment of the present invention. The structure of a wafer level semiconductor package 4 according to the fourth embodiment is similar to that of the first embodiment. Differently, for heat dissipation to be improved, a thermal conductive adhesive 48 is provided on an inactive surface 411 of a chip 41 and a second surface 402 of the rigid frame 40. Subsequently, a heat sink 49 is attached to the thermal conductive adhesive 48, so that heat generated by the chip 41 is dissipated into atmosphere via the heat sink 49.

Fifth Embodiment

Figure 6:
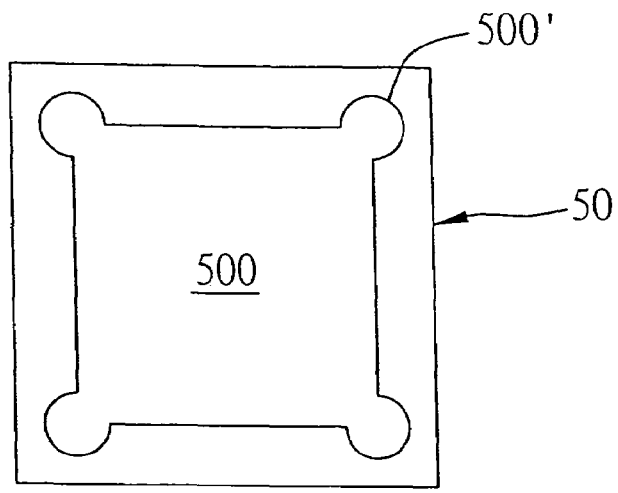
FIG. 6 is a top view of a rigid frame being used in a wafer level semiconductor package according to another embodiment of the present invention.
Figure 7:
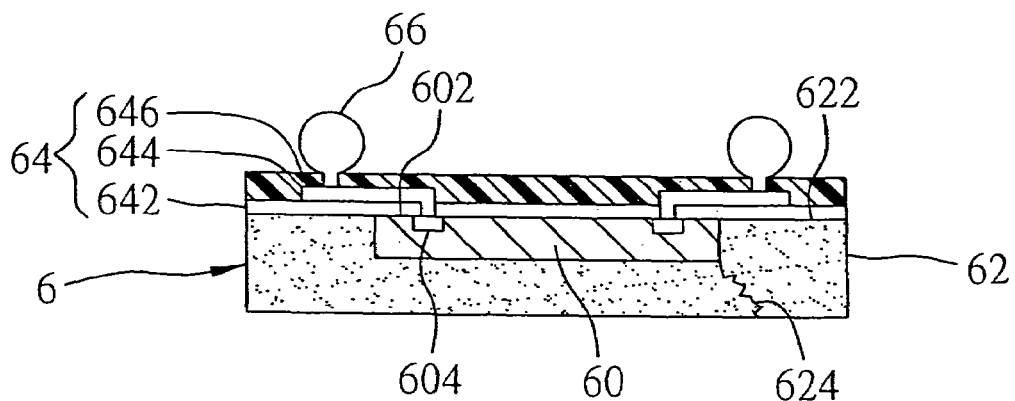
FIG. 7 is a cross-sectional view of U.S. Pat. No. 6,271,469.
Figure 8:
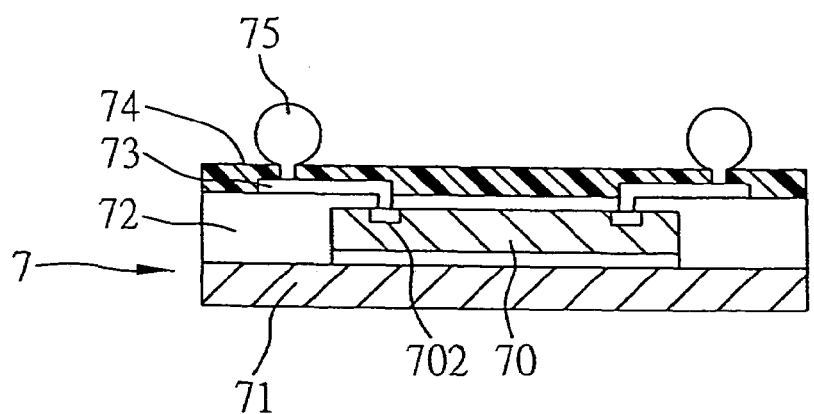
FIG. 8 is a cross-sectional view of U.S. Pat. No. 6,498,387.

FIG. 6 is a top view of a rigid frame being used in a wafer level semiconductor package according to another embodiment of the present invention. A rigid frame 50 of the fifth embodiment is similar to that of each of the foregoing embodiments. Differently, in order to further prevent the rigid frame 50 from cracking at a corner 500' of a through hole 500 caused by stresses of concentration, the corner 500' of the through hole 500 is rounded to effectively release the stress, so as to avoid a crack of the rigid frame 50.

It should be apparent to those skilled in the art that the above description is only illustrative of specific embodiments and examples of the present invention. The present invention should therefore cover various modifications and variations made to the herein-described structure and operations of the present invention, provided they fall within the scope of the present invention as defined in the following appended claims.

What is claimed is:

1. A method of fabricating a wafer level semiconductor package with a build-up layer, which comprises:
   preparing a module board having a plurality of rigid frames with through holes, wherein the rigid frames are arranged in arrays;
   placing the module board into a receiver formed by a jig;
   placing at least a chip into each of the through holes such that the chip is carried on the jig and a predetermined space is formed between the chip and the corresponding rigid frame of the module board;
   filling a low-modulus buffer material in the predetermined space such that the chip and the corresponding rigid frame are separated by the low-modulus buffer material;
   separating the module board from the jig;
   forming the build-up layer on the module board and the chip such that the build-up layer is electrically connected to the chip and a plurality of conductive elements are electrically connected to the build-up layer; and
   forming the wafer level semiconductor package with the build-up layer by performing a singulation process.

2. The method of claim 1, wherein the low-modulus buffer material is filled in the predetermined space between the chip and the corresponding rigid frame using a screen-printing method which employees the module board serving as a screen-printing plate.

3. The method of claim 1, wherein an inactive surface of the chip is exposed from the low-modulus buffer material when a thickness of the chip is the same as that of the corresponding rigid frame.

4. The method of claim 1, wherein an inactive surface of the chip is covered by the low-modulus buffer material when a thickness of the chip is smaller than that of the corresponding rigid frame.

5. The method of claim 1, wherein the rigid frames are made of a material selected from the group consisting of glass, metal and thermosetting materials.

6. The method of claim 1, wherein the low-modulus buffer material is selected from the group consisting of silicone gel, epoxy resins and polyimide resins.

7. The method of claim 1, wherein the conductive elements are solder balls.

8. A method of fabricating a wafer level semiconductor package with a build-up layer, which comprises:
   placing a module board having a plurality of rigid frames with through holes into a receiver formed by a jig, wherein the rigid frames are arranged in arrays, so that a plurality of chips carried in the jig are respectively received in each of the through holes of the rigid frames and a predetermined space is formed between the chip and the corresponding rigid frame;
   filling a low-modulus buffer material in the predetermined space so that each of the chips and the corresponding rigid frame are separated by the low-modulus buffer material;
   separating the module board carrying the chips from the jig;
   forming the build-up layer on the module board and the chips such that the build-up layer is electrically connected to the chips and a plurality of conductive elements are electrically connected to the build-up layer; and
   forming the wafer level semiconductor package with the build-up layer by performing a singulation process.

9. The method of claim 8, wherein the low-modulus buffer material is filled in the predetermined space between the chip and the corresponding rigid frame using a screen-printing method which employees the module board serving as a screen-printing plate.

10. The method of claim 8, wherein an inactive surface of the chip is exposed from the low-modulus buffer material when a thickness of the chip is the same as that of the corresponding rigid frame.

11. The method of claim 8, wherein an inactive surface of the chip is covered by the low-modulus buffer material when a thickness of the chip is smaller than that of the corresponding rigid frame.

12. The method of claim 8, wherein the rigid frames are made of a material selected from the group consisting of glass, metal and thermosetting materials.

13. The method of claim 8, wherein the low-modulus buffer material is selected from the group consisting of silicone gel, epoxy resins and polyimide resins.

14. The method of claim 8, wherein the conductive elements are solder balls.

* * * * *